US008864871B2

(12) United States Patent
Lee et al.

(10) Patent No.: US 8,864,871 B2
(45) Date of Patent: Oct. 21, 2014

(54) METHOD FOR MANUFACTURING COPPER NANOPARTICLES USING MICROWAVES

(75) Inventors: Young-Il Lee, Anyang-si (KR); Jae-Woo Joung, Suwon-si (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 1115 days.

(21) Appl. No.: 11/892,711

(22) Filed: Aug. 27, 2007

(65) Prior Publication Data
US 2008/0072706 A1 Mar. 27, 2008

(30) Foreign Application Priority Data
Sep. 21, 2006 (KR) .......................... 10-2006-0091542

(51) Int. Cl.
*B22F 1/00* (2006.01)
*B22F 9/00* (2006.01)
*C21B 15/04* (2006.01)
(Continued)

(52) U.S. Cl.
CPC ............... *B22F 9/24* (2013.01); *B22F 2999/00* (2013.01); *B82Y 30/00* (2013.01); *B22F 2998/00* (2013.01); *C30B 7/14* (2013.01); *C30B 29/602* (2013.01); *Y10S 977/773* (2013.01); *Y10S 977/775* (2013.01); *Y10S 977/777* (2013.01); *Y10S 977/81* (2013.01); *Y10S 977/932* (2013.01)
USPC .................. 75/345; 75/343; 75/330; 204/155; 204/156; 204/157.15; 204/157.4; 204/157.43; 977/773; 977/775; 977/777; 977/810; 977/932

(58) Field of Classification Search
None
See application file for complete search history.

(56) References Cited

U.S. PATENT DOCUMENTS 5,759,230 A * 6/1998 Chow et al. ..................... 75/362
5,902,498 A 5/1999 Mistry et al.
(Continued)

FOREIGN PATENT DOCUMENTS

JP 10-505538 6/1998
JP 2000-256707 9/2000
(Continued)

OTHER PUBLICATIONS

Zhu et al (Zu et al, Rapid synthesis of copper nanoparticles by sodium hypophosphite reduction in ethylene glycol under microwave irradiation, 270 Journal of Crystal Growth, at 722 (Oct. 2004).*
(Continued)

*Primary Examiner* — Yoshitoshi Takeuchi
(74) *Attorney, Agent, or Firm* — McDermott Will & Emery LLP

(57) ABSTRACT

The present invention relates to a method for manufacturing copper nanoparticles, in particular, to a method for manufacturing copper nanoparticles, wherein the method includes preparing a mixture solution including a copper salt, a dispersing agent, a reducing agent and an organic solvent; raising temperature of the mixture solution up to 30-50° C. and agitating; irradiating the mixture solution with microwaves; and obtaining the copper nanoparticles by lowering temperature of the mixture solution.

According to the present invention, several tens of nm of copper nanoparticles having a narrow particle size distribution and good dispersibility can be synthesized in mass production.

6 Claims, 6 Drawing Sheets

(51) Int. Cl.

| | |
|---|---|
| C22B 5/20 | (2006.01) |
| C22C 1/04 | (2006.01) |
| C21C 1/06 | (2006.01) |
| C22B 1/06 | (2006.01) |
| C25B 5/00 | (2006.01) |
| C07C 1/00 | (2006.01) |
| C07C 2/00 | (2006.01) |
| C07C 4/00 | (2006.01) |
| C07C 5/00 | (2006.01) |
| C07C 6/00 | (2006.01) |
| B01J 19/12 | (2006.01) |
| A62D 3/00 | (2006.01) |
| B82Y 30/00 | (2011.01) |
| C30B 7/14 | (2006.01) |
| B22F 9/24 | (2006.01) |
| C30B 29/60 | (2006.01) |

(56) References Cited

U.S. PATENT DOCUMENTS 6,833,019 B1  12/2004  Lewis, III et al.

2003/0051580 A1*  3/2003  Lewis et al. ............ 75/362
2007/0180954 A1*  8/2007  Kim et al. ............... 75/373

FOREIGN PATENT DOCUMENTS

| JP | 2003-013105 | 1/2003 |
| JP | 2004-131781 | 4/2004 |
| JP | 2005-163142 | 6/2005 |
| JP | 2006-183092 | 7/2006 |
| JP | 2006-517260 | 7/2006 |

OTHER PUBLICATIONS

Gerbec et al, Microwave-Enhanced Reaction Rates for Nanoparticle Synthesis, 125 JACS 15791-15800 (2005).*

Engineering Page, http://www.engineeringpage.com/technology/thermal/fouling_mechanisms.html (Dec. 2005).*

Japanese Office Action, with partial English translation, issued in Japanese Patent Application No. 2007-242572, mailed Feb. 22, 2011.

Japanese Reason of Rejection, w/ English translation thereof, issued in Japanese Patent Application No. JP 2007-242572 dated Sep. 14, 2010.

Japanese Office Action, and partial English translation thereof, issued in Japanse Patent Application No. 2007-242572 dated Jun. 1, 2012.

* cited by examiner

METHOD FOR MANUFACTURING COPPER NANOPARTICLES USING MICROWAVES

CROSS-REFERENCE TO RELATED APPLICATIONS

This application claims the benefit of Korean Patent Application No. 10-2006-0091542 filed on Sep. 21, 2006, with the Korea Intellectual Property Office, the contents of which are incorporated here by reference in their entirety.

BACKGROUND

1. Technical Field

The present invention relates to a method for manufacturing copper nanoparticles using microwaves.

2. Description of the Related Art

In response to demands for electronic components with miniaturization and high-densification, needs for metal patterning in a thin film using inkjet or formation of microwiring on a substrate have been increased. To implement this, it is necessary to produce conductive ink which is made from nano size of copper particles having a uniform shape, a narrow distribution of particles and an excellent dispersibility.

There are various methods of producing copper nanoparticles, such as mechanical grinding method, co-precipitation method, spray, sol-gel method, electro-deposition method, and microemulsion method, etc. In case of producing metal nanoparticles by the co-precipitation method widely used, it is impossible to control size, shape, size distribution of particles. In case of producing by the electro-deposition method and sol-gel method, it is difficult to produce in mass production and production cost is high. Also, in case of producing by the microemulsion method, it is easy to control size, shape, size distribution of particles, however, it is not suitable for practical use as the production process is complicated.

Recently, there is an attempt to producing copper nanoparticles using the wet reduction process. A partial reduction method using hydrazine has been suggested as a proper means in production of copper particles with particle size of 0.1-100 μm.

Japanese patent publication No. 02-294414 suggested a method for producing copper particles including adding an alkali hydroxide and a reducing sugar to a copper salt solution in the presence of one or more compound selected from group consisting of amino acid and its salt, ammonia and its ammonium salt, organic amine and dimethyl glyoxime and precipitating the copper oxide particles; and subsequently reducing the copper oxide particles with hydrazine.

Also, Korean patent publication No. 2005-3169 suggested a method for preparing 0.3-4 μm size of copper particles including preparing an aqueous solution of a copper salt complex by mixture an aqueous solution of a copper salt with ammonia solution; and reducing the result solution with ascorbic acid to obtain copper powder, wherein a surfactant is added to control the nucleus size and growth of particles.

Japanese patent publication No. 2004-353038 suggested a synthetic method using microwave for preparing silver ultrafine particles with size of less than 10 nm, including dispersing a fatty acid metal salt into a reductive organic alcohol solvent and irradiating the mixture to reduce from metal ions.

Copper particles produced by the above-mentioned wet method were characterized that the particle size distribution is small or the particle size is uniform, however, they have actually a broad particle size distribution and have not provided the formation of small and uniform particles with size less than 100 nm. Also, there is no description regarding the synthesis of copper nanoparticles by employing microwaves.

SUMMARY

The present invention was accomplished taking into account of the problems as described above. The present invention provides a method for preparing copper nanoparticles with size of nm in mass having a narrow particle size distribution and an excellent dispersibility by employing an appropriate dispersing agent and a reducing agent in an organic solvent such as polyol, etc. and irradiating with microwaves.

One aspect of the invention may provide a method for manufacturing copper nanoparticles, including: preparing a mixture solution including a copper salt, a dispersing agent, a reducing agent and an organic solvent; raising temperature of the mixture solution up to 30-50° C. and agitating; irradiating the mixture solution with microwaves; and obtaining the copper nanoparticles by lowering temperature of the mixture solution.

Here, the copper salt is at least one compound selected from a group consisting of $CuCl_2$, $Cu(NO_3)_2$, $CuSO_4$, $(CH_3COO)_2Cu$, copper(II) acetylacetonate, copper(II) carbonate, copper(II) cyclohexane butyrate, copper(II) stearate, copper(II) perchlorate, copper(II) ethylenediamine and $Cu(OH)_2$. Here, the copper salt is used by 0.001 to 1 mole in the mixture solution.

Here, the dispersing agent is at least compound selected from the group consisting of PVP (polyvinylpyrrolidone), CTAB (cetyltrimethylammonium bromide), SDS (sodium dodecyl sulfate) and Na-CMC (sodium carboxymethyl cellulose). Here, the dispersing agent is used in a mole ratio of 1 to 20 with respect to 1 mole of the copper salt.

Here, the reducing agent is at least one compound selected from the group consisting of $NaHPO_2$, $N_2H_4$, hydrochloride and $NaBH_4$. Here, the reducing agent is used in a mole ratio of 2 to 6 with respect to 1 mole of the copper salt.

Here, the organic solvent is at least one compound selected from the group consisting of ethylene glycol, diethylene glycol, triethylene glycol and polyethylene glycol.

Here, the irradiation strength is 0.01 to 0.5 $W/cm^3$. Here, the irradiation time is 2 to 10 minutes.

Here, the step of obtaining the copper nanoparticles is performed by quick-freezing the mixture solution using cooled distilled water.

Also here, the step of obtaining the copper nanoparticles further includes, isolating copper nanoparticles by centrifuging the mixture solution; and washing the isolated copper nanoparticles and drying.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION

Figure 1:
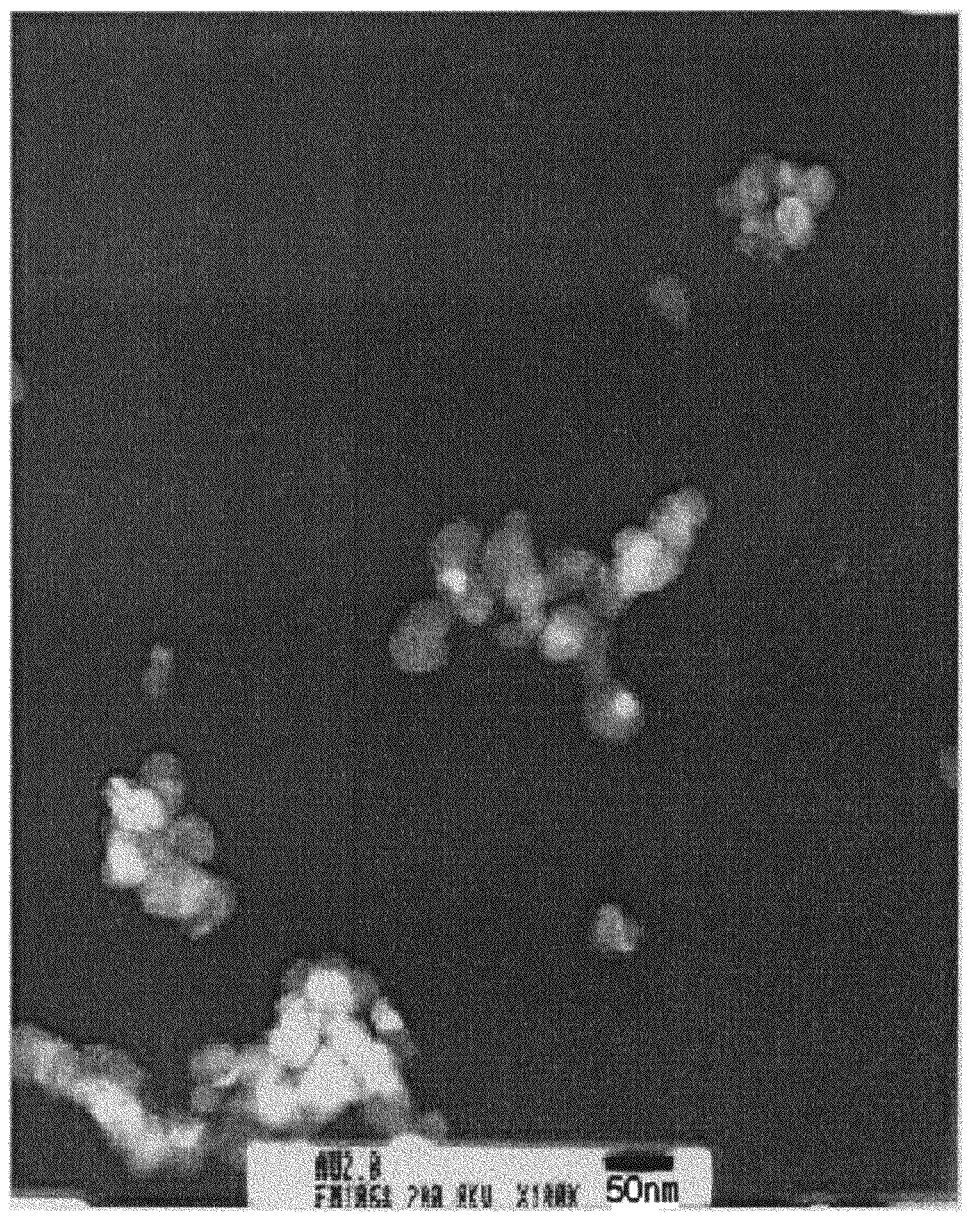
FIG. 1 is a TEM image of the copper nanoparticles produced according to example 1 of the invention.

Hereinafter, preferred embodiments will be described in detail of the method of producing copper nanoparticles and the copper nanoparticles thus produced according to the present invention.

A method using microwave has advantages in that the process is simple and the reaction time is short and uniform nanoparticles can be synthesized from various metals, compared with the wet reduction process generally used in the synthesis of nanoparticles. However, there has been practically no method for producing the copper nanoparticles using microwave. There are some cases that metal nanoparticles such as silver, nickel etc. are synthesized, however, this is impossible to form nanoparticles of uniform size and allows to form nanoparticles only in quantities of several tens of mg, which presents a limitation to practical use in industrial applications. Therefore, in the present invention, among various metal nanoparticles, copper nanoparticles that is in the recent spotlight as a material for embodying microwiring in a substrate or metal patterning of a thin film through inkjet has been synthesized by employing microwaves. According to the present invention, it provides the formation of copper nanoparticles by using microwaves within a short period of time with a simple process, in which the copper nanoparticles have a particle size of several tens of nm, uniform particle size distribution and dispersibility to allow mass production.

The method for producing copper nanoparticles according to the present invention, includes, preparing a mixture solution including a copper salt, a dispersing agent, a reducing agent and an organic solvent; raising temperature of the mixture solution up to 30-50° C. and agitating; irradiating the mixture solution with microwaves; and obtaining the copper nanoparticles by lowering the temperature of the mixture solution.

In the present invention, the mixture solution including a copper salt, a dispersing agent, a reducing agent and an organic solvent is prepared.

The copper salt may be a soluble copper salt such as $CuCl_2$, $Cu(NO_3)_2$, $CuSO_4$, $(CH_3COO)_2Cu$, copper (II) acetylacetonate, copper (II) carbonate, copper (II) cyclohexane butyrate, copper (II) stearate, copper (II) perchlorate, copper (II) ethylenediamine, $Cu(OH)_2$, etc. which is used individually or as a mixture. Here, it is more preferable that the best reactive $CuSO_4$ be used alone.

The copper salt may be mixed in 0.001 to 1 mole ratio in the mixture solution. If the concentration of the copper salt is less than 0.001 mole, it is impossible to obtain the desired amount of copper nanoparticles. If the concentration of the copper salt is more than 1 mole, it may cause rapid growth of particles and thus, be difficult to obtain uniform particle size of nanoparticles.

The dispersing agent in the present may be at least one compound selected from the group consisting of PVP (polyvinylpyrrolidone), CTAB (cetyltrimethylammonium bromide), SDS (sodium dodecyl sulfate) and Na-CMC (sodium carboxymethyl cellulose). PVP with 40,000 of molecular weight may be used individually. PVP of high molecular weight may control the particle size and uniformity of the copper nanoparticles and give effective dispersibility by preventing coagulation in an aqueous system.

The content of the dispersing agent may be 1 to 20 mole ratio with respect to 1 mole of the copper salt. If the dispersing agent is added less than 1 mole, it may be difficult to obtain uniform nanoparticles as the controlling effect of the copper nanoparticles is decreased. If the dispersing agent is added more than 20 moles, it may be difficult to mix the reaction solution uniformly due to the viscosity increased with use of a large quantity of the high molecular dispersing agent and it is not economical since a large quantity of solvent is required to remove side products and any remaining organic compound.

If the reducing agent is used in the preparing of the mixture solution, copper ions can be reduced more stably and swiftly. Examples of the reducing agent, which can be used in the present invention, may include sodium hypophosphate ($NaH_2PO_2$), hydrazine ($N_2H_4$), hydrochloride and sodium borohydride ($NaBH_4$), preferably sodium hypophosphate ($NaH_2PO_2$). The reducing agent is mixed in a mole ratio of 2 to 6 with respect to 1 mole of copper salt. If the content of reducing agent is less than 2 moles, copper ions in the mixture solution cannot be reduced completely. If it is more than 6 moles, unwanted reactant is produced excessively and it is not economical as they are added more than necessary amount for 100% copper reduction.

Also, the organic solvent used in the mixture solution may be a reductive organic solvent such as polyol. For example, it may be at least one compound selected from the group consisting of ethylene glycol, diethylene glycol, triethylene glycol and polyethylene glycol, more preferably, ethylene glycol alone.

After preparing the mixture solution including the above components, the mixture solution is heated to 30 to 50° C. and then agitated.

The mixture solution may be generally prepared and reacted at room temperature, however, it is preferable that the mixture solution be agitated after its temperature is raised to an appropriate temperature considering solubility of the dispersing agent. The temperature may be raised to 30 to 50° C. Within this range of temperature, it is easy to dissolve the solute such as the dispersing agent and reduce the irradiating time in the following irradiating step. If the temperature is lower than 30° C., it is not easy to dissolve the solute. If the temperature is higher than 50° C., it is not preferable as a reduction reaction can be performed according to reactant conditions.

After raising the temperature of the mixture solution and agitating, the mixture solution is irradiated with microwave.

An equipment for the microwave irradiation may be, without a particular limitation, any equipment with irradiation intensity enabling reduction of the copper salt, for example a common microwave oven using 2.45 GHz wave, which can sufficiently induce the reduction reaction.

Condition of the microwave irradiation may vary with components to be used, however, the intensity of microwave may be 0.01 to 0.5 $W/cm^3$. If the intensity is less than 0.01 $W/cm^3$, the reaction time is elongated and the copper salt cannot be reduced efficiently. If the intensity is more than 0.5 $W/cm^3$, the reaction time is extremely shortened and it is difficult to control the particle size distribution to be narrow. Also, the irradiating time may be 2 to 10 minutes. If the irradiating time is less than 2 minutes, the copper ions cannot be reduced sufficiently. If the irradiating time is more than 10 minutes, the copper particles may be overgrown and the size of the copper nanoparticles cannot be controlled uniformly.

When the reaction is irradiated by microwaves, the mixture solution turns from blue to dark brown as the copper ions are reduced, which indicates that the reaction is completed. When the color of the mixture solution turns to dark brown or dark red, irradiation of microwave is stopped and reaction is completed as soon as possible since if the reaction time is elongated, growth of particles cannot be uniform.

If the reaction is completed, the copper nanoparticles is obtained by cooling down the temperature of the mixture solution.

This is to prevent overgrowth of the copper nanoparticles by cooling down the temperature of the mixture solution, the temperature of mixture solution may be cooled down lower than 50° C. According to an example, the mixture solution can be quick-freezed using cooled distilled water.

The step of obtaining the copper nanoparticles may further include, isolating the copper nanoparticles by centrifuging of the mixture solution; and washing the isolated copper nanoparticles and drying.

According an example, centrifuging may be performed for 1 to 10 minutes at 2000 to 5000 rpm. Also, the isolated copper nanoparticles may be washed using acetone and distilled water to remove unwanted reactants and remaining organic compounds and may be dried using 30 to 60° C. of a vacuum dryer.

The method of producing copper nanoparticles and copper nanoparticles thus produced were set forth above in detail, and hereinafter, explanations will be given in greater detail with specific examples. While the embodiment of the present invention provides the production of copper nanoparticles, the invention is not limited to the examples stated below and may be used for production of another copper nanoparticles. It is also apparent that more changes may be made by those skilled in the art without departing from the principles and spirit of the present invention.

EXAMPLE 1

After copper sulfate 0.1 mole, sodium hypophosphate 0.4 mole, PVP 1 mole and ethylene glycol 500 ml were mixed in a beaker and were heated to 40° C., the mixture solution were dissolved while agitating. The prepared mixture solution was irradiated with microwaves for 3 minutes in a microwave oven. When the mixture solution turned to dark brown by the reduction reaction, irradiating of microwaves was stopped and 500 ml of cooled distilled water was added to the mixture solution for quick-freezing. Using centrifugation, the copper nanoparticles of dark brown was recovered, washed with acetone and distilled water 3 times, and dried in the vacuum dryer of 50° C. for 3 hours to obtain 6 g of the copper nanoparticle powder.

EXAMPLE 2

After copper sulfate 0.2 mole, sodium hypophosphate 0.8 mole, PVP 2 mole and ethylene glycol 1000 ml were mixed in a beaker and were heated to 40° C., the mixture solution was dissolved while agitating. The prepared mixture solution was irradiated with microwaves for 7 minutes in a microwave oven. When the mixture solution turned to dark brown by reduction reaction, irradiating of microwaves was stopped and 1000 ml of cooled distilled water was added to the mixture solution for quick-freezing. Using centrifugation, the copper nanoparticles of dark brown was recovered, washed with acetone and distilled water 3 times, and dried in the vacuum dryer of 50° C. for 3 hours to obtain 12 g of the copper nanoparticle powder.

Figure 2:
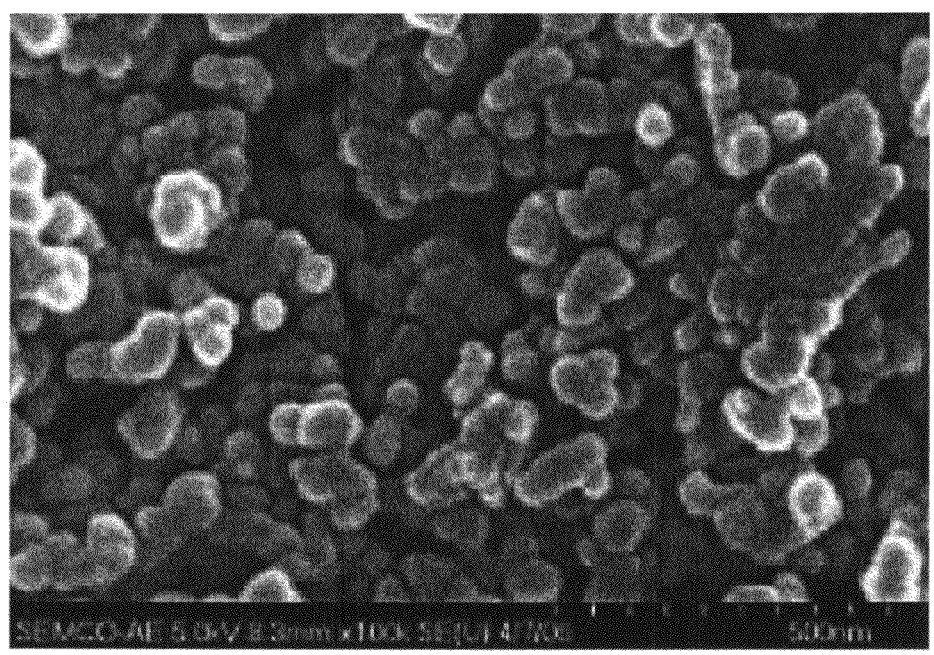
FIG. 2 is a SEM image of the copper nanoparticles produced according to example 1 of the invention.

FIG. 1 represents a TEM image of the copper nanoparticles obtained in Example 1 and FIG. 2 represents a SEM image of the copper nanoparticles obtained in Example 1. As shown in FIGS. 1 and 2, it is noted that the copper nanoparticles have a particle size of 30-50 m and spherical shape.

Figure 3:
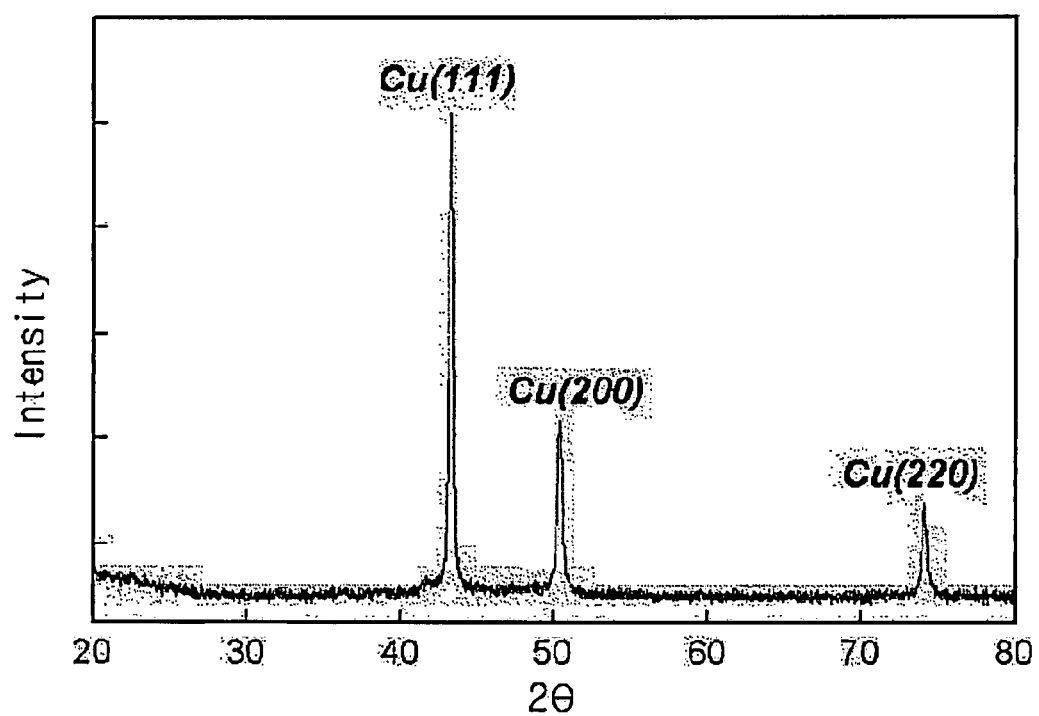
FIG. 3 is a graph representing XRD (X-ray diffraction) analysis for the copper nanoparticles produced according to example 1 of the invention.

FIG. 3 represents a XRD analysis of the copper nanoparticles prepared in Example 1. According to FIG. 3 it is noted that the copper nanoparticles are pure crystals without impurities and oxide forms.

Figure 4:
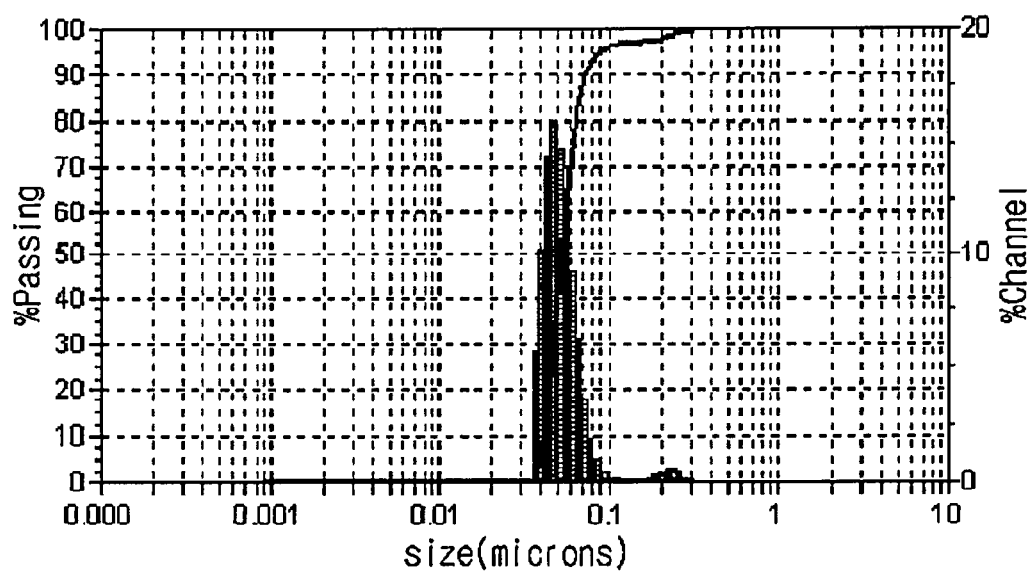
FIG. 4 is a graph representing particle size analysis for the copper nanoparticles produced according to example 1 of the invention.

FIG. 4 represents a particle size analysis of the copper nanoparticles obtained from Example 1 using a particle size analyzer. According to FIG. 4, it is noted that the copper nanoparticle has a narrow particle size distribution.

Figure 5:
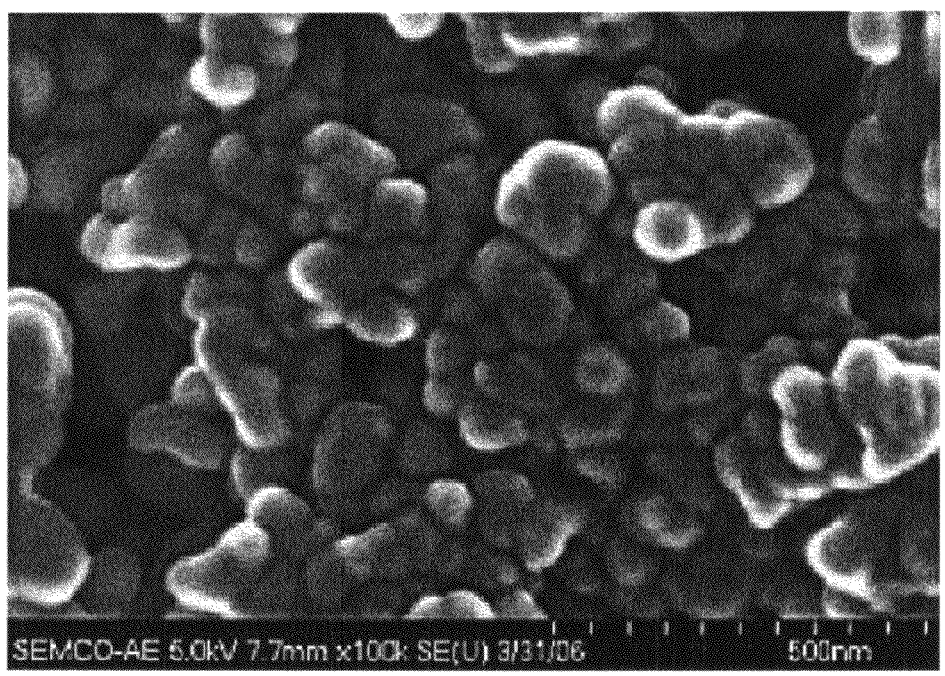
FIG. 5 is a SEM image of the copper nanoparticles produced according to example 2 of the invention.

Also, FIG. 5 is a SEM image of the copper nanoparticles obtained from Example 2. According to FIG. 5, it is noted that the copper nanoparticles have a particle size of 50-70 nm and are uniform.

Figure 6:
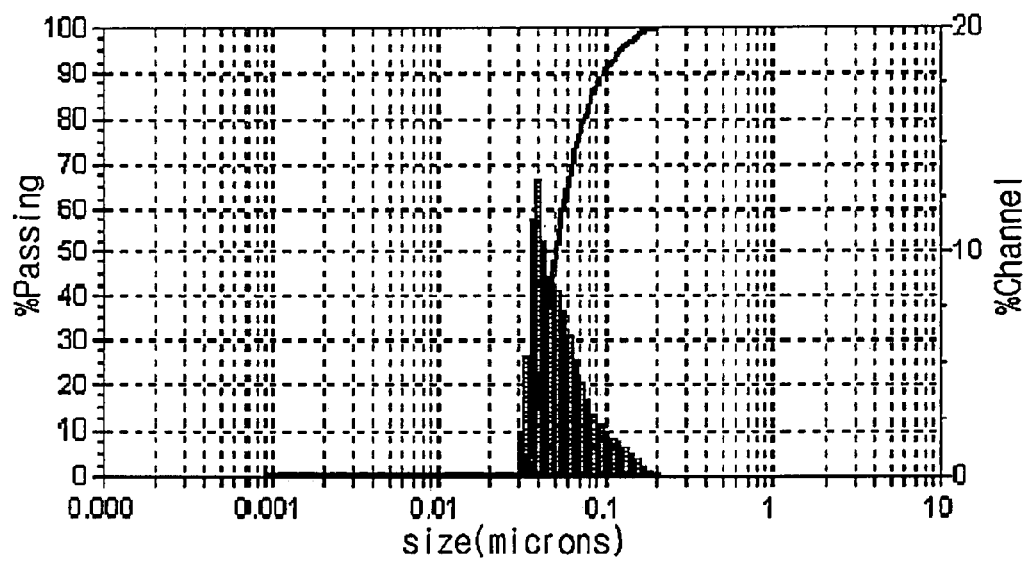
FIG. 6 is a graph representing the results of particle size analysis for the copper nanoparticles produced according to example 2 of the invention.

FIG. 6 represents a particle size analysis of the copper nanoparticles obtained from Example 2 using a particle size analyzer. According to FIG. 6, it is noted that the copper nanoparticles has a narrow particle size distribution.

As described in the Examples, it is identified that, according to the method for producing copper nanoparticles of the present invention, the copper nanoparticle with several tens of nm and dispersability can be synthesized for the simple process in a short time using microwaves.

The invention is not limited to the examples stated below and may be used for production of another copper nanoparticles. It is also apparent that more changes may be made by those skilled in the art without departing from the principles and spirit of the present invention.

What is claimed is:

1. A method for manufacturing copper metal nanoparticles with 50-70 nm size for conductive ink for wiring pattern formation, using microwaves, the method comprising:
    preparing a mixture solution comprising a copper salt, a dispersing agent that is used in a mole ratio of 1 to 20 with respect to 1 mole of the copper salt, a reducing agent that is used in a mole ratio of 2 to 6 with respect to 1 mole of the copper salt, and an organic solvent,
        wherein the copper salt is at least one compound selected from the group consisting of $CuCl_2$, $Cu(NO_3)_2$, $CuSO_4$, $(CH_3COO)_2Cu$, copper(II) acetylacetonate, copper (II) carbonate, copper (II) cyclohexane butyrate, copper (II) stearate, copper (II) perchlorate, copper (II) ethylenediamine and $Cu(OH)_2$;
    raising temperature of the mixture solution up to 30-50° C. and agitating;
    irradiating, after raising the temperature of the mixture solution up to 30-50° C. and agitating, the mixture solution with microwaves,
    wherein the strength of irradiating is 0.01 to 0.5 W/cm$^3$ and the time of irradiating is 2 to 10 minutes; and
    obtaining the copper metal nanoparticles by lowering a temperature of the mixture solution,
    the obtained copper metal nanoparticles having a particle size of 50-70 nm.

2. The method of claim 1, wherein the copper salt is used in a mole ratio of 0.001 to 1 in the mixture solution.

3. The method of claim 1, wherein the dispersing agent is at least compound selected from the group consisting of PVP (polyvinylpyrrolidone), CTAB (cetyltrimethylammonium bromide), SDS (sodium dodecyl sulfate) and Na-CMC (sodium carboxymethyl cellulose).

4. The method of claim 1, wherein the reducing agent is at least one compound selected from the group consisting of $NaH_2PO_2$, $N_2H_4$, hydrochloride and $NaBH_4$.

5. The method of claim 1, wherein the organic solvent is at least one compound selected from the group consisting of ethylene glycol, diethylene glycol, triethylene glycol and polyethylene glycol.

6. The method of claim 1, wherein the step of obtaining the copper nanoparticles further comprises:
- isolating the copper nanoparticles by centrifuging the mixture solution; and
- washing the isolated copper nanoparticles and drying.

* * * * *